(12) United States Patent
Hidaka et al.

(10) Patent No.: US 9,159,848 B2
(45) Date of Patent: Oct. 13, 2015

(54) LIGHT RECEIVING CIRCUIT

(71) Applicant: KABUSHIKI KAISHA TOSHIBA, Minato-ku (JP)

(72) Inventors: Miki Hidaka, Hukuoka-ken (JP); Shigeyuki Sakura, Kanagawa-ken (JP); Masayuki Sugizaki, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 185 days.

(21) Appl. No.: 14/023,395

(22) Filed: Sep. 10, 2013

(65) Prior Publication Data
US 2014/0284459 A1    Sep. 25, 2014

(30) Foreign Application Priority Data
Mar. 22, 2013    (JP) .................. 2013-061151

(51) Int. Cl.
*H01J 40/14*    (2006.01)
*H01L 31/02*    (2006.01)
*H03F 1/22*    (2006.01)
*H03F 3/08*    (2006.01)
*H03F 3/45*    (2006.01)

(52) U.S. Cl.
CPC .... *H01L 31/02019* (2013.01); *H01L 31/02016* (2013.01); *H03F 1/223* (2013.01); *H03F 3/082* (2013.01); *H03F 3/45192* (2013.01); *H03F 2203/45336* (2013.01); *H03F 2203/45674* (2013.01)

(58) Field of Classification Search
CPC .............. H01L 31/02016; H01L 31/02002
USPC .............. 250/214 A, 214 R, 214 LA, 214 LS, 250/214 AG; 330/59, 308
See application file for complete search history.

(56) References Cited

U.S. PATENT DOCUMENTS

| 2005/0218938 | A1  | 10/2005 | Sugano |
|---|---|---|---|
| 2006/0027736 | A1* | 2/2006  | Ichino et al. .............. 250/214 R |
| 2007/0075223 | A1* | 4/2007  | Murao et al. .............. 250/214 A |
| 2008/0074198 | A1* | 3/2008  | Ohnishi ........................ 330/308 |
| 2013/0068935 | A1  | 3/2013  | Sakura |

FOREIGN PATENT DOCUMENTS

| JP | 2006-303044 A | 10/1994 |
|---|---|---|
| JP | 2000-068551 A | 3/2000 |
| JP | 2001-085548 A | 3/2001 |
| JP | 2004-343441 A | 12/2004 |
| JP | 2005-277554 A | 10/2005 |
| JP | 2007-005901 A | 1/2007 |
| JP | 2008-167364 A | 7/2008 |
| JP | 2009-044684 A | 2/2009 |

OTHER PUBLICATIONS

Japanese Office Action issued on Jun. 4, 2015 in corresponding Japanese Application No. 2013-061151, along with English translation thereof.

* cited by examiner

*Primary Examiner* — Kevin Pyo
(74) *Attorney, Agent, or Firm* — White & Case LLP

(57) ABSTRACT

According to one embodiment, a light receiving circuit includes a light receiving element, a differential circuit, a fifth transistor, and first and second current sources. The differential circuit includes an amplifier and a bias circuit. The amplifier includes a first transistor, a second transistor, and a first feedback resistor. The amplifier is configured to convert a current from the light receiving element into a voltage. The bias circuit includes a third transistor, a fourth transistor, and a second feedback resistor. A reference voltage is supplied to a control electrode of the fourth transistor. The second and third transistors are included in a current mirror circuit. A fifth transistor has a control electrode connected to a connection point between the first and second transistors. A voltage signal switched to a high level or a low level according to a change of an optical signal is outputted.

14 Claims, 10 Drawing Sheets

$Vth+Vov \fallingdotseq 1V$

US 9,159,848 B2

LIGHT RECEIVING CIRCUIT

CROSS-REFERENCE TO RELATED APPLICATIONS

This application is based upon and claims the benefit of priority from Japanese Patent Application No. 2013-061151, filed on Mar. 22, 2013; the entire contents of which are incorporated herein by reference.

FIELD

Embodiments described herein relate generally to a light receiving circuit.

BACKGROUND

A light receiving circuit that is mounted in, for example, a photocoupler is widely used in electronic devices for industry, for communication, for households, etc.

In such an electronic device, a signal is transmitted between different power supply systems such as a DC voltage system, an AC power supply system, a telephone line system, etc.

By using the photocoupler, an electrical signal can be transmitted in a state in which the different power supply systems are insulated.

The photocoupler includes the light receiving circuit that changes the optical signal into the electrical signal. In the case where the light receiving circuit includes a MOS transistor, the cut-off frequency of the transimpedance amplifier can be increased and a high speed response is easy to realize by increasing the transconductance.

However, the capacitance of the MOS transistor becomes large; the switching time of the current comparator that has a cascade connection to the transimpedance amplifier becomes long; and such a configuration is not quite sufficient to increase the operation speed of the entire light receiving circuit.

Also, in the case where the reverse voltage of the light receiving element is low, the operation speed of the entire light receiving circuit decreases due to the higher junction capacitance.

DETAILED DESCRIPTION

In general, according to one embodiment, a light receiving circuit includes a light receiving element, a differential circuit, a fifth transistor, a first current source and a second current source. The light receiving element is configured to convert an optical signal into a current. One terminal of the light receiving element is connected to a first potential. The differential circuit includes an amplifier and a bias circuit. The amplifier includes a first transistor, a second transistor, and a first feedback resistor of a feedback loop for the first transistor. The amplifier is configured to convert the current from the light receiving element into a voltage. The bias circuit includes a third transistor, a fourth transistor, and a second feedback resistor of a feedback loop for the fourth transistor. A reference voltage is supplied to a control electrode of the fourth transistor. The second transistor and the third transistor are included in a current mirror circuit. A fifth transistor has a control electrode connected to a connection point between the second transistor and the first transistor. A first current source has one terminal connected to the first potential and one other terminal configured to supply a current to the fifth transistor. A second current source has one terminal connected to the first potential and one other terminal configured to supply a current to the differential circuit. A voltage signal switched to a high level or a low level according to a change of the optical signal is outputted from a connection point between the first current source and the fifth transistor.

Embodiments of the invention will now be described with reference to the drawings.

Figure 1:
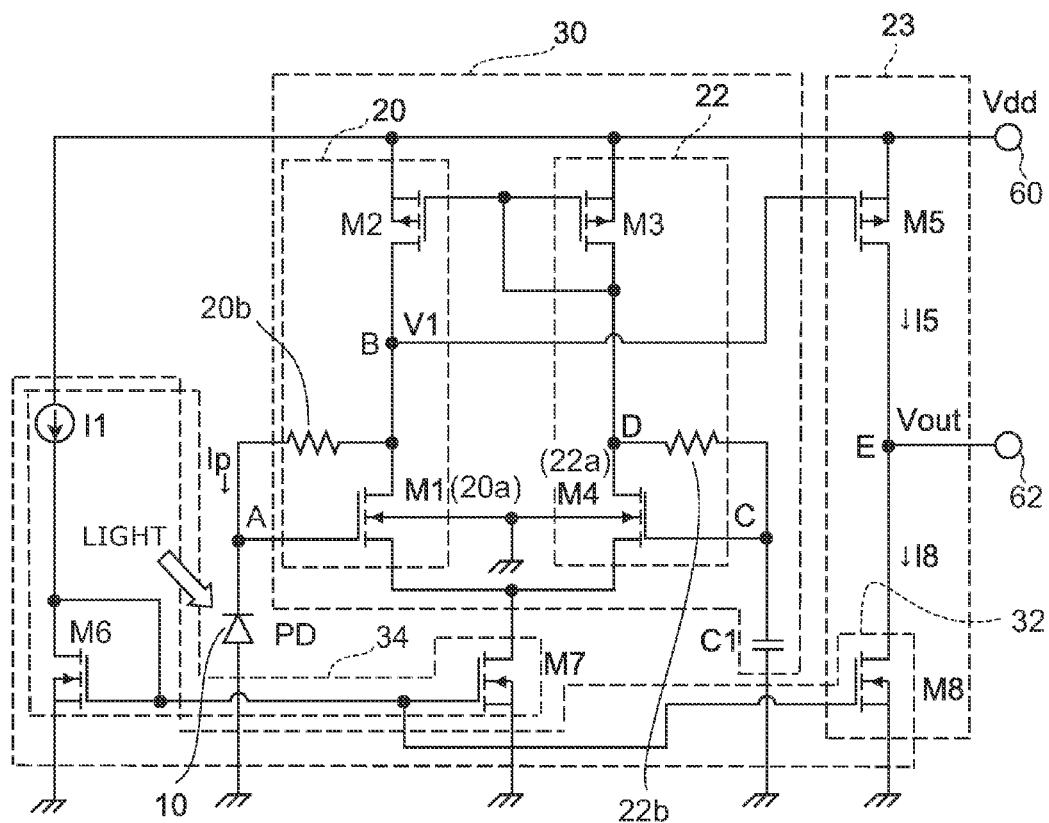
FIG. 1 is a circuit diagram of a light receiving circuit according to a first embodiment.

FIG. 1 is a circuit diagram of a light receiving circuit according to a first embodiment.

The light receiving circuit includes a light receiving element 10, a differential circuit 30, a fifth transistor M5, a first current source 32, and a second current source 34.

One terminal of the light receiving element 10 is connected to a first potential (e.g., ground); and the light receiving element 10 converts an optical signal into a current. The light receiving element 10 may be a silicon (Si) photodiode, etc.

The differential circuit 30 includes an amplifier 20 and a bias circuit 22. The amplifier 20 includes a first transistor M1 (20a), a first feedback resistor 20b, and a second transistor M2; and the amplifier 20 converts a current Ip from the light receiving element 10 into a voltage. The amplifier 20 is a transimpedance amplifier in which the connection point between the feedback resistor 20b and the gate (the control terminal) of the first transistor M1 is used as an input terminal A; and the drain of the first transistor M1 is used as an output terminal B.

The bias circuit 22 includes a fourth transistor M4 (22a), a second feedback resistor 22b, and a third transistor M3. In the bias circuit 22, the connection point between the second feedback resistor 22b and the gate (the control terminal) of the fourth transistor M4 is used as an input terminal C; and the drain of the fourth transistor M4 is used as an output terminal D. The gate of the fourth transistor M4 is connected to a capacitor C1, etc.; and a reference voltage is supplied to the gate of the fourth transistor M4. The second transistor M2 and the third transistor M3 are included in a current mirror circuit.

The gate (the control terminal) of the fifth transistor M5 is connected to the output terminal B of the amplifier 20. The output terminal B has a potential V1. The fifth transistor M5 and an eighth transistor M8 function as a comparator 23.

The first current source 32 includes a current mirror circuit including a sixth transistor M6 and the eighth transistor M8 and supplies a current to the fifth transistor M5. Also, the second current source 34 includes a current mirror circuit including the sixth transistor M6 and a seventh transistor M7 and supplies a current to the differential circuit 30. In the drawings, the first current source 32 and the second current source 34 are included in a multiple output current mirror circuit.

The light receiving circuit is configured to switch a voltage signal Vout to a high level or a low level according to the change of the optical signal and output the voltage signal Vout from an output terminal E which is the connection point between the first current source 32 and the drain of the fifth transistor M5.

In FIG. 1, the first, fourth, seventh, and eighth transistors M1, M4, M7, and M8 are n-channel enhancement-mode MOSFETs. The second, third, and fifth MOS transistors M2, M3, and M5 are p-channel MOSFETs; and the sources of the second, third, and fifth MOS transistors M2, M3, and M5 are connected to a second potential (e.g., a power supply voltage Vdd).

In the case where the first to eighth transistors are MOSFETs, the conductivity types of the channels may be opposite conductivity types.

Figure 2A:
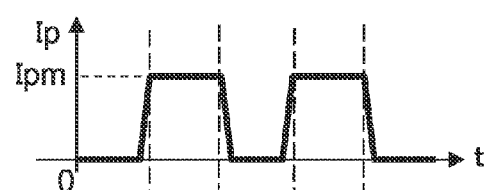
FIG. 2A shows a waveform diagram of the current of the light receiving element.
Figure 2B:
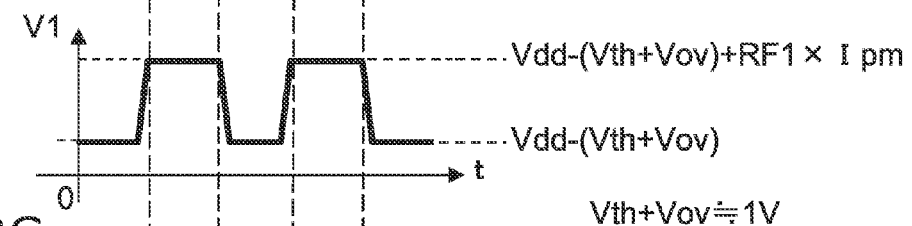
FIG. 2B shows a waveform diagram of the of potential V1 of the terminal B.
Figure 2C:
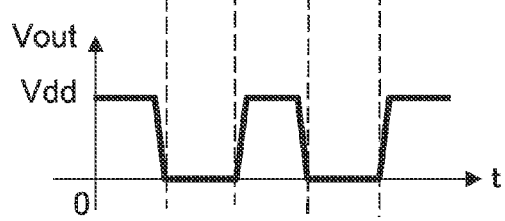
FIG. 2C shows a waveform diagram of the voltage signal Vout of the output terminal 62.

FIGS. 2A to 2C are operation waveform diagrams of the first embodiment. FIG. 2A shows the current of the light receiving element; FIG. 2B shows the potential V1 of the terminal B; and FIG. 2C shows the voltage signal Vout of the output terminal 62.

In the interval in which there is no pulse optical signal, a reverse voltage VPD applied to the light receiving element 10 can be expressed by Formula (1) using a threshold Vth3 of the third MOS transistor M3, an overdrive voltage Vov of the third MOS transistor M3, and the power supply voltage Vdd.

$$VPD=Vdd-(Vth3+Vov) \quad \text{Formula (1)}$$

In the case where Vdd=5 V, Vth3=0.8 V, and Vov=0.2 V, the reverse voltage VPD applied to the light receiving element 10 becomes 4 V. In other words, by using the differential circuit configuration, the reverse-biased voltage of the light receiving element 10 is increased. Therefore, the junction capacitance of the light receiving element 10 is reduced; and the bandwidth can be increased.

When the pulse optical signal is irradiated, the current Ip starts to flow as shown in FIG. 2A. The potential V1 of the input terminal A when the current Ip reaches a peak value Ipm (e.g., several μA) is expressed by Formula (2).

$$V1=VPD=RF1 \times Ipm \quad \text{Formula (2)}$$

The potential V1 of the input terminal A of the differential circuit 30 changes according to the current Ip as shown in FIG. 2B.

Although the fifth transistor M5 attempts to cause a drain current I5 to flow and the eighth transistor M8 attempts to cause a drain current I8 to flow, the smaller current of the two currents actually flows.

In the interval in which the optical signal is not irradiated, the potential V1 which is the gate voltage of the fifth transistor M5 is low; and the voltage signal Vout of the output terminal 62 increases as shown in FIG. 2C. Therefore, because a drain-source potential Vds of the fifth transistor M5 becomes lower than Vov, the fifth transistor M5 operates in the linear region and functions as a resistor. As a result, a drain current Id (M5) of the fifth transistor M5 is determined by the drain current Id (M8) of the eighth transistor M8 operating in the saturated region. In other words, because I5>I8, the voltage signal Vout becomes substantially Vdd as shown in FIG. 2C.

On the other hand, in the interval in which the optical signal is irradiated and the current Ipm flows, the gate potential V1 of the fifth transistor M5 increases; and a gate-source voltage Vgs of the fifth transistor M5 decreases. Therefore, because I5<I8, the voltage signal Vout is switched to the low level (substantially GND) as shown in FIG. 2C.

Figure 3:
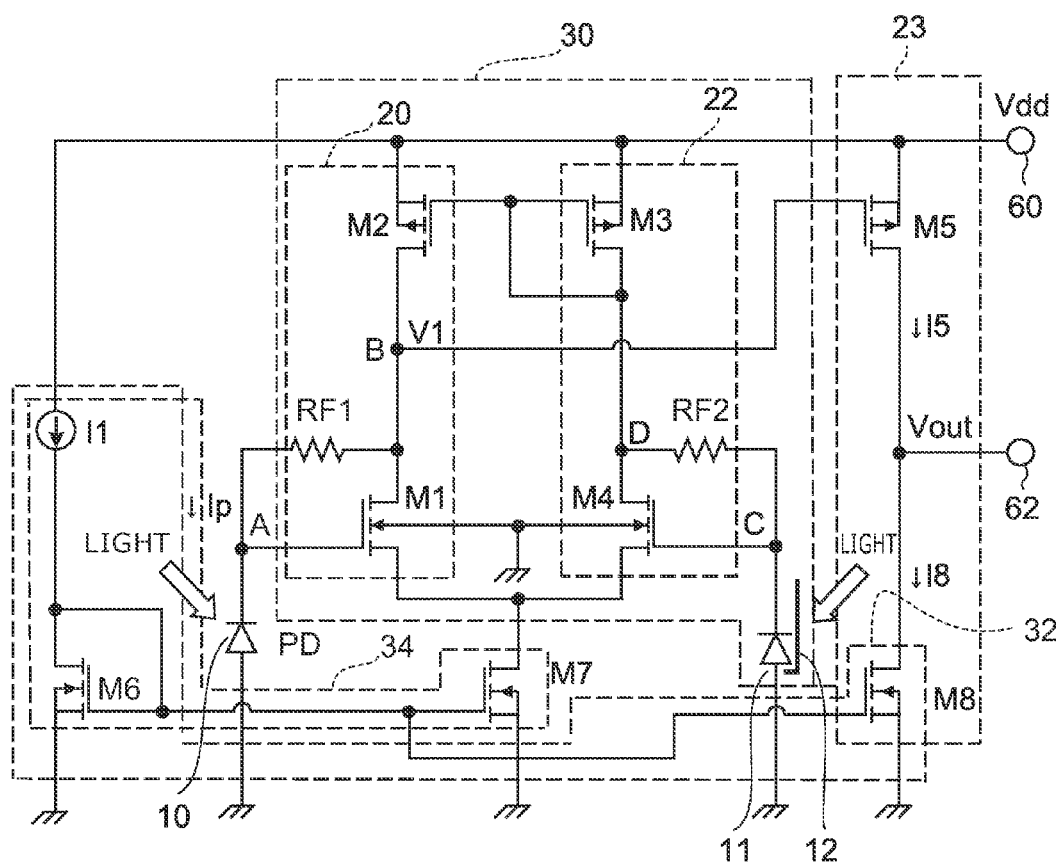
FIG. 3 is a circuit diagram of the light receiving circuit according to a modification of the first embodiment.

FIG. 3 is a circuit diagram of the light receiving circuit according to a modification of the first embodiment.

The gate (the control electrode) of the fourth transistor M4 may be connected to a dummy light receiving element 11. In such a case, when the light reception surface is covered with a light-shielding plate 12, the reference voltage is supplied to the gate to function as the differential circuit 30.

Figure 4:
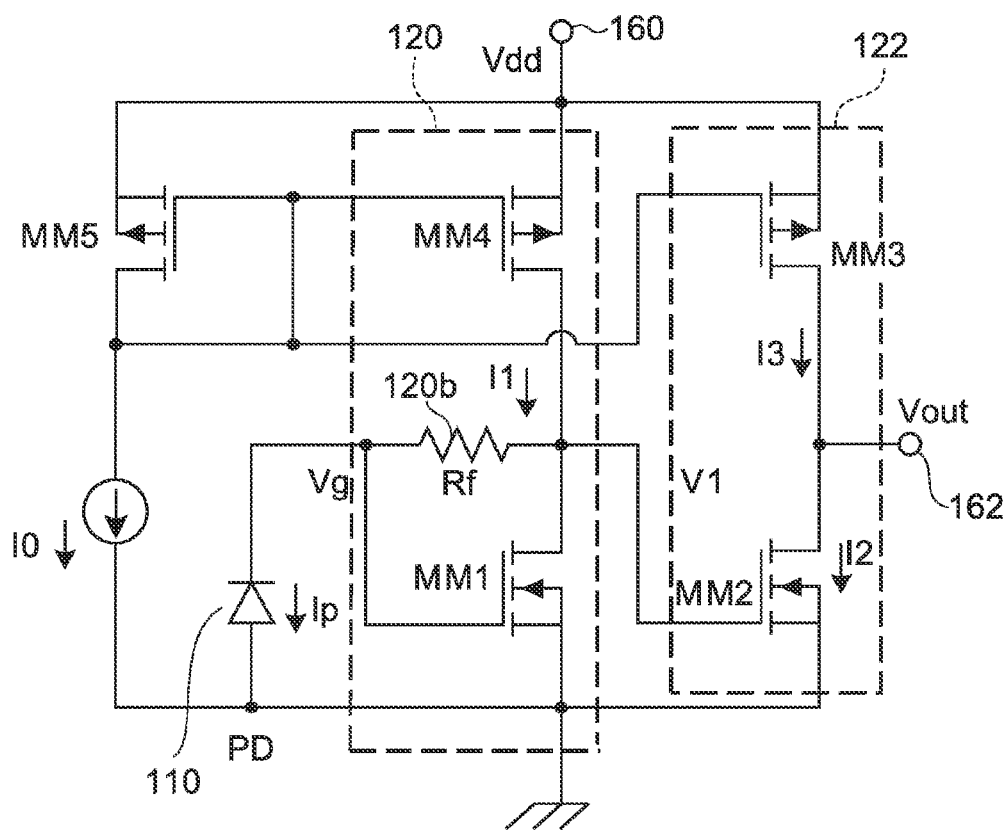
FIG. 4 is a circuit diagram of a light receiving circuit according to a comparative example.

FIG. 4 is a circuit diagram of a light receiving circuit according to a comparative example.

The light receiving circuit includes a light receiving element 110, a transimpedance amplifier 120, and a comparator 122. The transimpedance amplifier 120 includes a first MOS transistor MM1 and a feedback resistor 120b. In the comparative example, the reverse voltage applied to the light receiving element 110 is the sum (Vth+Vov) of a threshold voltage Vth of the first MOS transistor MM1 and the overdrive voltage Vov and is low at about 0.8 to 1 V. Therefore, the junction capacitance increases; the frequency band of the light receiving circuit becomes narrow; and the operation speed decreases.

Conversely, in the first embodiment, because the reverse voltage VPD of the light receiving element 10 is high at about 4 V, the junction capacitance is reduced; and the operation speed can be increased.

Figure 5:
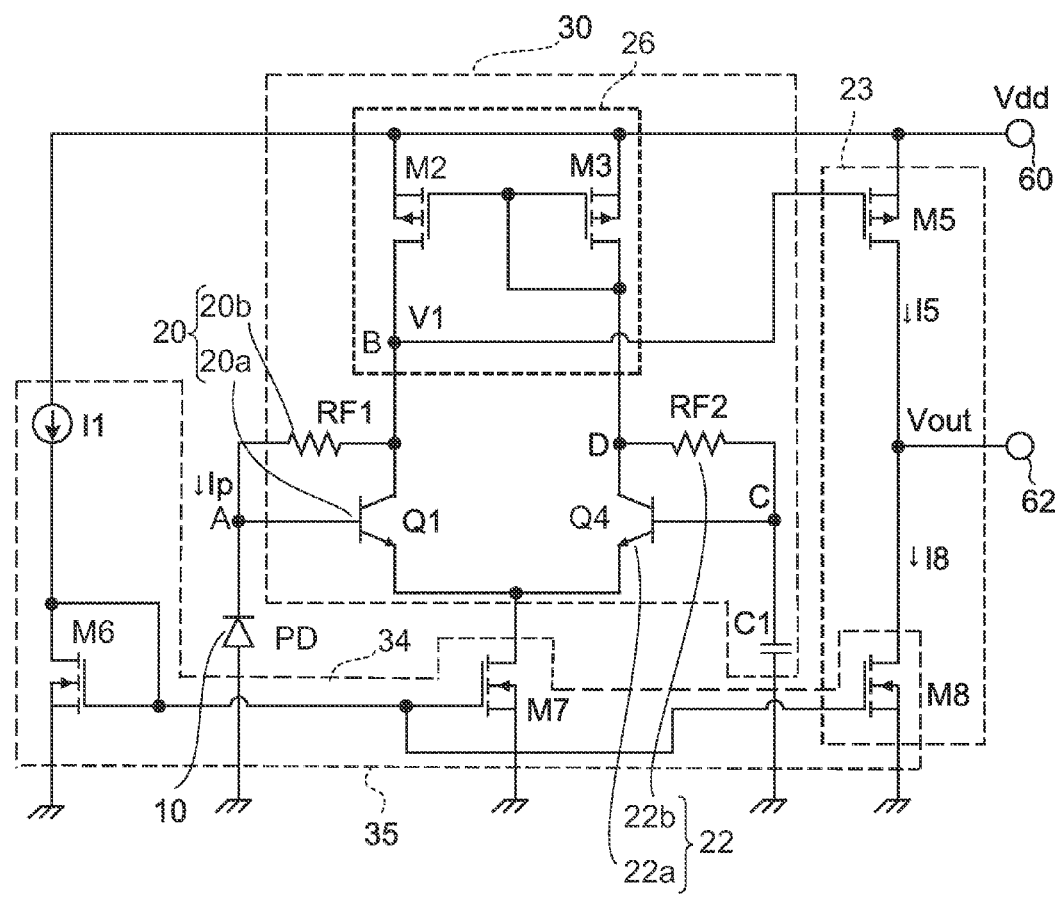
FIG. 5 is a circuit diagram of a light receiving circuit according to a second embodiment.

FIG. 5 is a circuit diagram of a light receiving circuit according to a second embodiment.

The light receiving circuit includes the light receiving element 10, the differential circuit 30, the fifth transistor M5, a current mirror circuit 26, and multiple output current mirror circuits 35. The fifth transistor M5 and the eighth transistor M8 function as the comparator 23.

In the second embodiment, a first transistor Q1 and a fourth transistor Q4 are npn-type bipolar transistors. The second, third, and fifth transistors (M2, M3, and M5) are p-channel enhancement-mode MOSFETs. The sixth to the eighth transistors (M6 to M8) are n-channel enhancement-mode MOSFETs. Because the amplifier 20 that functions as a transimpedance amplifier includes the bipolar transistor, a light receiving circuit is possible in which the frequency band is widened while maintaining a large transconductance gm.

The current mirror circuit 26 supplies a current to the first transistor Q1. The multiple output current mirror circuits 35 supply currents to the differential circuit 30 and the eighth transistor M8. As described below in detail, it becomes easy to increase the frequency band of the light receiving circuit by using the bipolar transistor in the amplifier 20.

Figure 6:
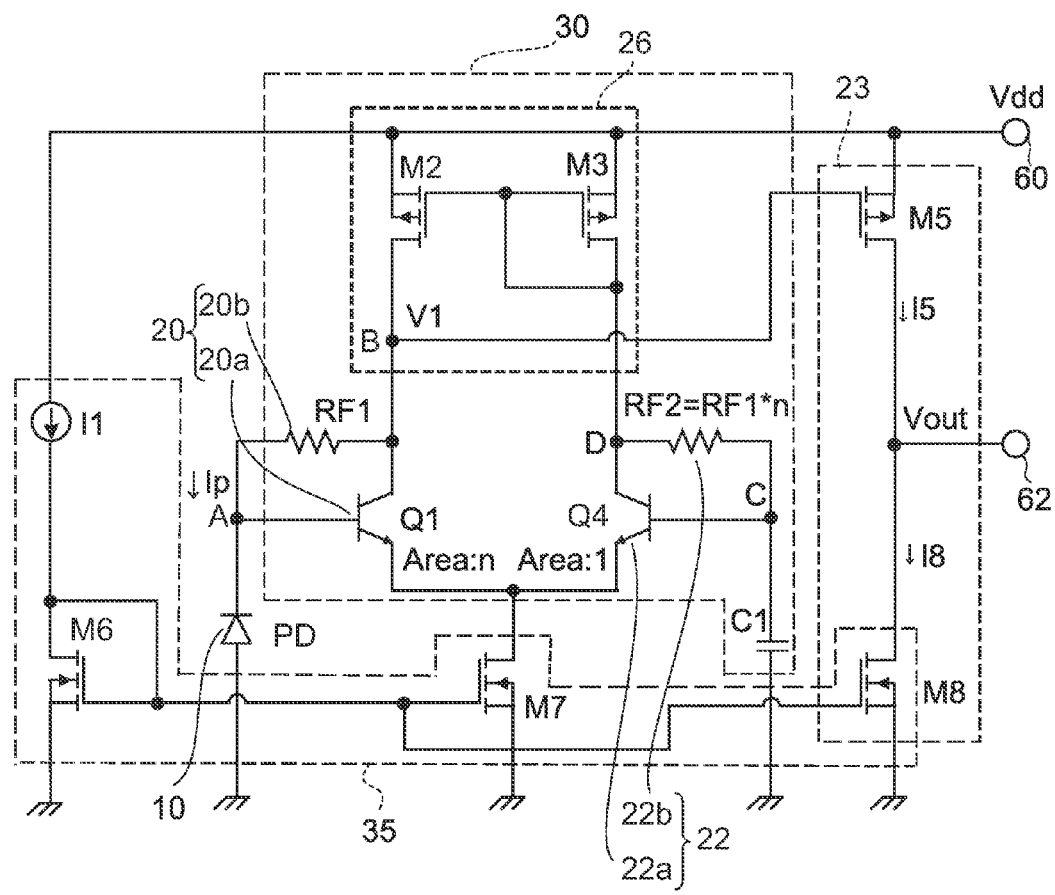
FIG. 6 is a circuit diagram of a light receiving circuit according to a modification of the second embodiment.

FIG. 6 is a circuit diagram of a light receiving circuit according to a modification of the second embodiment.

In a circuit configuration similar to that of the second embodiment, the emitter/base junction area ratio (Se1/Sb1) of the first transistor Q1 is set to be n (wherein n>1) times the emitter/base junction area ratio (Se4/Sb4) of the fourth transistor Q4. In such a case, the resistance value of the second feedback resistor 22b is set to be n times the resistance value of the first feedback resistor 20b (RF2=RF1×n). And the gate width (W2)/gate length (L2) ratio of the second transistor M2 is equal to n (wherein n>1)×the gate width (W3)/gate length (L3) ratio of the third transistor M3. Thus, the currents flowing in the third transistor M3 and the fourth transistor Q4 can be reduced while maintaining the frequency band of the amplifier 20.

Figure 7:
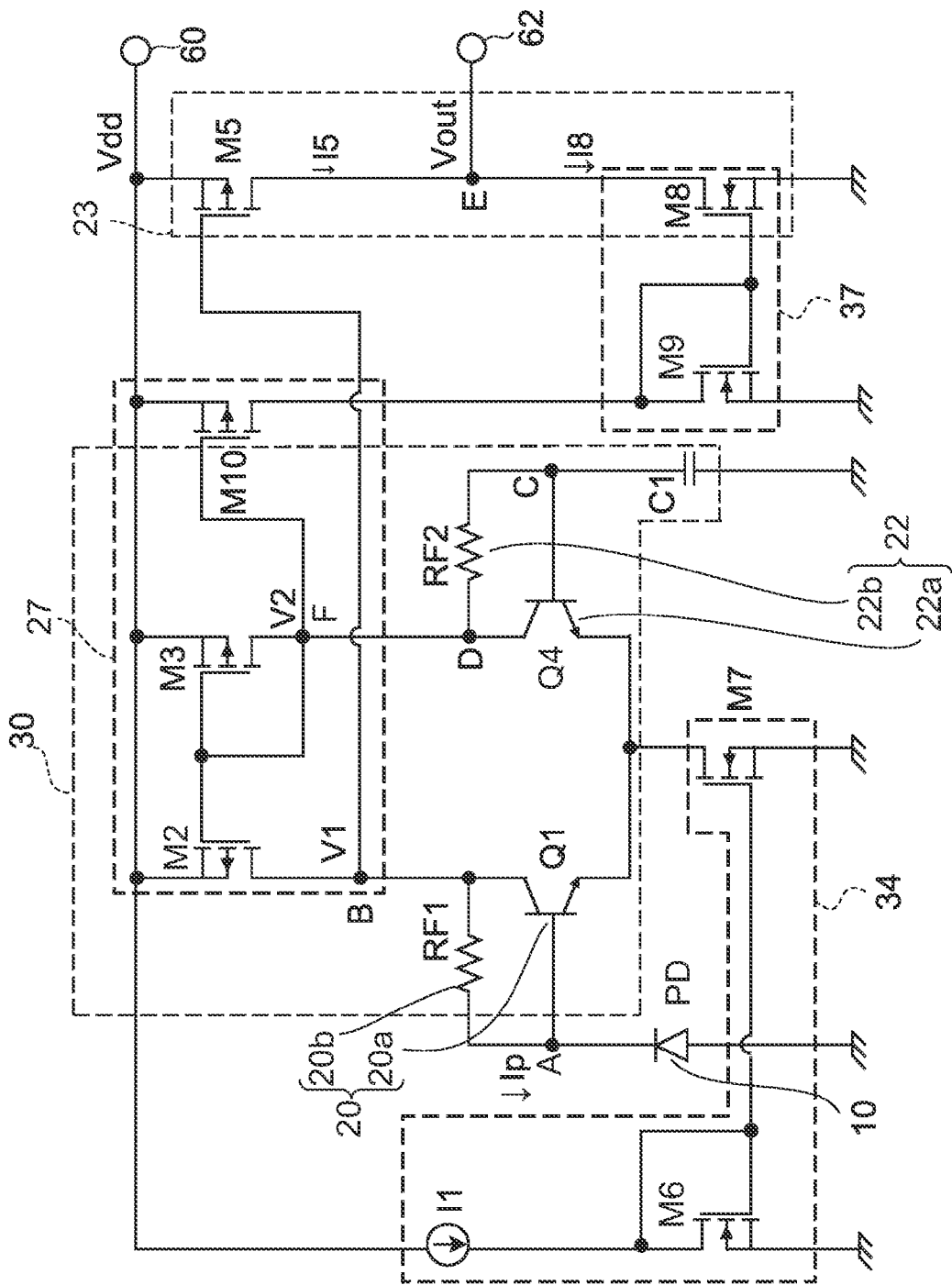
FIG. 7 is a circuit diagram of a light receiving circuit according to a third embodiment.

FIG. 7 is a circuit diagram of a light receiving circuit according to a third embodiment.

The light receiving circuit of the third embodiment has a configuration in which the first current source of the second embodiment is modified. Namely, the light receiving circuit further includes: a ninth transistor M9, which is included in a current mirror circuit 37 with the eighth transistor M8; and a tenth transistor M10 (p-channel), which is provided between the fifth transistor M5, a terminal F that has a second potential V2, and the ninth transistor M9 (n-channel).

The second transistor M2, the third transistor M3, the fifth transistor M5, and the tenth transistor M10 are set such that W2/L2=W3/L3=W10/L10<W5/L5.

Figure 8A:
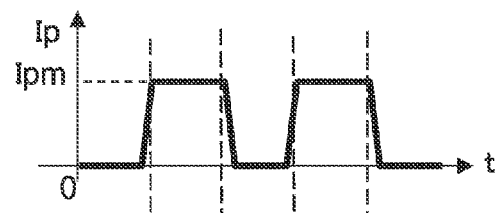
FIG. 8A shows a waveform diagram of the current of the light receiving element.
Figure 8B:
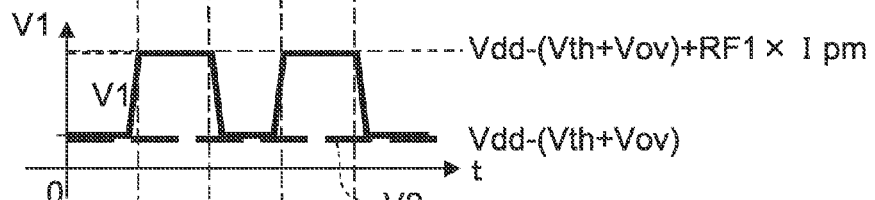
FIG. 8B shows a wave form diagram of the potential V1 of the terminal B.
Figure 8C:
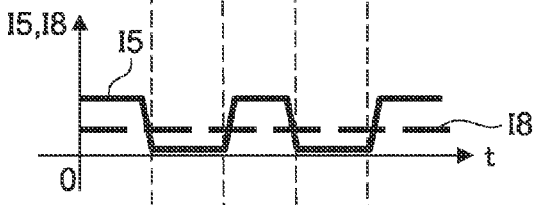
FIG. 8C shows a waveform diagram of the drain currents of the fifth and eighth transistors if a voltage source having a voltage of Vdd/2 is connected to the output terminal E.
Figure 8D:
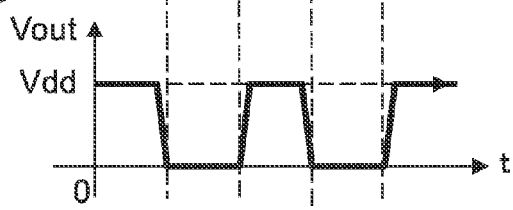
FIG. 8D shows a waveform diagram of the voltage signal Vout of the output terminal 62.

FIGS. 8A to 8D are operation waveform diagrams of the light receiving circuit according to the third embodiment. FIG. 8A shows the current of the light receiving element; FIG. 8B shows the potential V1 of the terminal B; FIG. 8C shows the drain currents of the fifth and eighth transistors if a voltage source having a voltage of Vdd/2 is connected to the output terminal E; and FIG. 8D shows the voltage signal Vout of the output terminal 62.

When there is no optical signal or the optical signal is extremely small, the potential V1 of the terminal B is equal to the potential V2. However, due to W10/L10<W5/L5. the current I8 that flows in the eighth transistor M8, the ninth transistor M9, and the tenth transistor M10 becomes less than I5. Therefore, the voltage signal Vout of the output terminal 62 is the high level. When the optical signal is irradiated, the gate-source voltage Vgs of the fifth transistor M5 decreases because the current Ip flows in the light receiving element 10, and the potential V1 of the terminal B increases. And the voltage signal Vout is switched to the low level when the current I8 becomes greater than the current I5.

Figure 9:
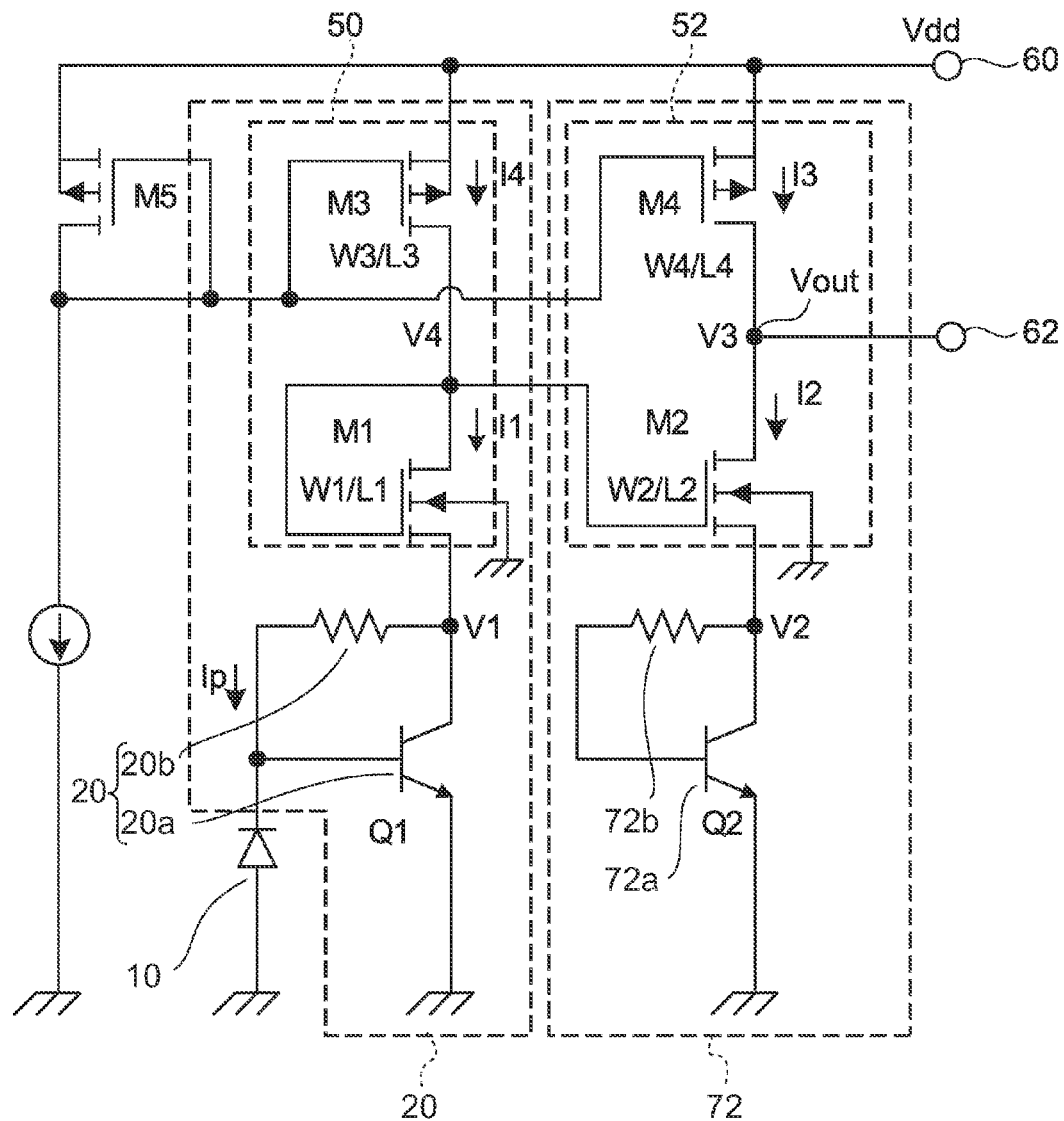
FIG. 9 is a circuit diagram of a light receiving circuit according to a fourth embodiment.

FIG. 9 is a circuit diagram of a light receiving circuit according to a fourth embodiment.

One terminal of the light receiving element 10 is connected to the first potential (e.g., ground); and the light receiving element 10 converts an optical signal into a current. The light receiving element 10 may be, for example, a Si photodiode, etc.

The amplifier 20 includes a first bipolar transistor Q1, the feedback resistor 20b, and a first current source 50 and functions as a transimpedance amplifier.

A comparator 72 includes a second bipolar transistor Q2 (72a), a feedback resistor 72b, and a second current source 52. A voltage signal V4 of the transimpedance amplifier 20 is connected to the gate of the second MOS transistor M2 of the comparator 72.

The gate and drain of the fifth MOS transistor M5 are connected to each other; and the fifth MOS transistor M5 is included in a multiple output current mirror circuit with the third MOS transistor M3 and the fourth MOS transistor M4.

The gate width (W2)/gate length (L2) ratio of the second MOSFET M2 is less than the gate width (W1)/gate length (L1) of the first MOSFET M1.

The connection point between the drain of the second MOS transistor M2 and the drain of the fourth MOS transistor M4 outputs the voltage signal Vout that is output from the comparator 72.

In the state in which there is no optical signal or when the optical signal is extremely small, the gate potential V4 of the second MOS transistor M2 is low. Therefore, the voltage signal output from the second MOS transistor M2 is the high level.

When the intensity of the optical signal starts to increase, the current starts to flow in the light receiving element 10; the gate voltage of the second MOS transistor M2 starts to increase; the second MOS transistor M2 is switched ON; and the voltage signal V4 is switched to the low level.

The ON/OFF rate of the voltage signal Vout is determined by the frequency band of the circuit of the transimpedance amplifier. The frequency band increases as the junction capacitance of the light receiving element 10 decreases. Also, the frequency band increases as the transconductance gm of the transistor of the transimpedance amplifier 20 increases.

Figure 10:
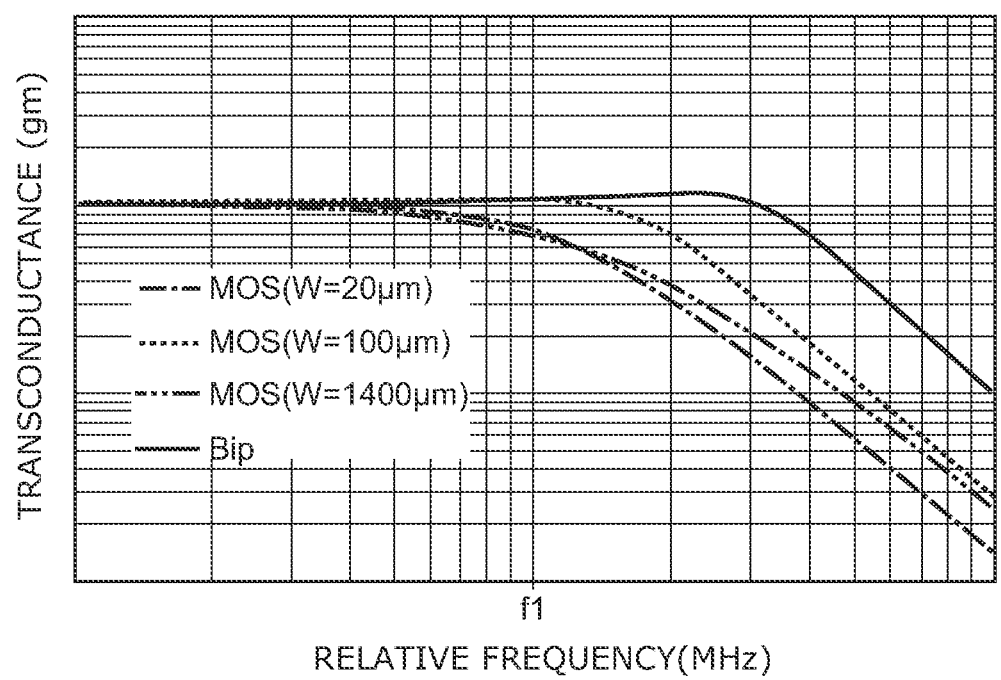
FIG. 10 is a graph showing the relative voltage gain of the transimpedance amplifier versus frequency.

FIG. 10 is a graph showing the relative voltage gain of the transimpedance amplifier versus frequency.

The frequency characteristic is shown for MOS transistor and the bipolar transistor, respectively. The frequency band is shown for MOS transistors having relatively large, medium, and small gate widths with the same gate length. Also, the frequency band is shown for when a transimpedance amplifier having a bipolar transistor is used in the same light receiving circuit. The transconductance gm increases proportionally to $(W1/L1)^{1/2}$ as the gate width W is increased. However, there is a gate width at which the frequency band is a maximum because the junction capacitance also increases. On the other hand, for the bipolar transistor, the frequency band has little dependence on the size of the bipolar transistor; and the frequency band is high. The frequency f1 in FIG. 10 can be as high as, for example, 100 MHz.

In other words, by using the bipolar transistor in the amplifier 20, it becomes easy to increase the frequency band of the light receiving circuit.

In the light receiving circuit according to the first to fourth embodiments, the frequency band is improved and a high-speed operation is easy to realize. A photocoupler including such a light receiving circuit can transmit signals between different power supply systems such as a DC voltage system, an AC power supply system, a telephone line system, etc., and can be widely used in electronic devices for industry, for communication, for households, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light receiving circuit comprising:
   a light receiving element configured to convert an optical signal into a current, one terminal of the light receiving element being connected to a first potential;
   a differential circuit including an amplifier and a bias circuit, the amplifier including a first transistor, a second transistor, and a first feedback resistor of a feedback loop for the first transistor, the amplifier being configured to convert the current from the light receiving element into a voltage, the bias circuit including a third transistor, a fourth transistor, and a second feedback resistor of a feedback loop for the fourth transistor, a reference voltage being supplied to a control electrode of the fourth transistor, the second transistor and the third transistor being included in a current mirror circuit;
a fifth transistor having a control electrode connected to a connection point between the second transistor and the first transistor;
a first current source having one terminal connected to the first potential and one other terminal configured to supply a current to the fifth transistor; and
a second current source having one terminal connected to the first potential and one other terminal configured to supply a current to the differential circuit,
a voltage signal switched to a high level or a low level according to a change of the optical signal being outputted from a connection point between the first current source and the fifth transistor.

2. The light receiving circuit according to claim 1, wherein the light receiving circuit further comprises a terminal configured to supply a second potential,
the second transistor is provided between the first transistor and the terminal,
the third transistor is provided between the fourth transistor and the terminal, and
the fifth transistor is connected between the first current source and the terminal.

3. The light receiving circuit according to claim 1, wherein the first to fifth transistors are MOS transistors.

4. The light receiving circuit according to claim 3, wherein the first and fourth transistors are n-channel enhancement mode transistors, and
the second, third, and fifth transistors are p-channel enhancement mode transistors.

5. The light receiving circuit according to claim 1, wherein the first and fourth transistors are bipolar transistors, and the second, third, and fifth transistors are MOS transistors.

6. The light receiving circuit according to claim 5, wherein the first and fourth transistors are npn-type transistors, and the second, third, and fifth transistors are p-channel enhancement mode transistors.

7. The light receiving circuit according to claim 5, wherein an emitter/base junction area ratio of the first transistor is n (wherein n>1) times an emitter/base junction area ratio of the fourth transistor, and
a resistance value of the second feedback resistor is n times a resistance value of the first feedback resistor.

8. The light receiving circuit according to claim 1, wherein the first current source and the second current source are included in a multiple output current mirror circuit.

9. The light receiving circuit according to claim 1, wherein a capacitor or a shielded light receiving element is provided between the first potential and the control electrode.

10. A light receiving circuit comprising:
a light receiving element configured to convert an optical signal into a current, one terminal of the light receiving element being connected to a first potential;
a differential circuit including an amplifier and a bias circuit, the amplifier including a first MOS transistor, a second MOS transistor, and a first feedback resistor provided between a drain of the first MOS transistor and a gate of the first MOS transistor, the amplifier being configured to convert the current of the light receiving element into a voltage, the bias circuit including a third MOS transistor, a fourth MOS transistor, and a second feedback resistor provided between a drain of the fourth MOS transistor and a gate of the fourth MOS transistor, the gate of the fourth MOS transistor being supplied with a reference voltage, the second MOS transistor and the third MOS transistor being included in a current mirror circuit characterized in that a source of the second MOS transistor is connected to a second potential, a drain of the second MOS transistor is connected to the drain of the first MOS transistor, a source of the third MOS transistor is connected to the second potential, and a drain of the third MOS transistor is connected to the drain of the fourth MOS transistor;
a fifth MOS transistor having a gate connected to the drain of the second MOS transistor and the drain of the first MOS transistor, and a source connected to the second potential;
a first current source having one terminal connected to the first potential and one other terminal configured to supply a current to a drain of the fifth transistor; and
a second current source having one terminal connected to the first potential and one other terminal configured to supply a current to the differential circuit,
the source of the second MOS transistor and the source of the third MOS transistor being connected to the second potential,
a drain voltage of the fifth MOS transistor being switched to a low level when the optical signal is switched ON, and
the drain voltage of the fifth MOS transistor being switched to a high level when the optical signal is switched OFF.

11. A light receiving circuit comprising:
a light receiving element configured to convert an optical signal into a current, one terminal of the light receiving element being connected to a first potential;
a transimpedance amplifier configured to convert the current from the light receiving element into a voltage, the transimpedance amplifier including a first bipolar transistor, a first feedback resistor, a first MOS transistor, and a first current source, the first bipolar transistor having a base connected to one other terminal of the light receiving element and an emitter connected to the first potential, the first feedback resistor being connected between the base of the first bipolar transistor and a collector of the first bipolar transistor, a gate of the first MOS transistor being connected to a drain of the first MOS transistor, the first current source being connected between the drain of the first MOS transistor and the second potential; and
a comparator including a second bipolar transistor, a second feedback resistor, a second MOS transistor, and a second current source, the second bipolar transistor having an emitter connected to the first potential, the second feedback resistor being connected between a base of the second bipolar transistor and a collector of the second bipolar transistor, the second MOS transistor having a gate connected to the drain of the first MOS transistor, the second current source being connected between a drain of the second MOS transistor and the second potential,
a voltage signal switched to a high level or a low level according to a change of the optical signal being outputted from the drain of the second MOS transistor.

12. The light receiving circuit according to claim 11, wherein
the first bipolar transistor and the second bipolar transistor are npn-type bipolar transistors, and
the first MOS transistor and the second MOS transistor are n-channel MOS transistors.

13. The light receiving circuit according to claim 11, wherein a gate width/gate length ratio of the second MOS transistor is less than a gate width/gate length ratio of the first MOS transistor.

14. The light receiving circuit according to claim 11, wherein the first current source and the second current source are included in a multiple output current mirror circuit.

* * * * *